United States Patent
Sandhu et al.

(10) Patent No.: US 6,554,910 B1
(45) Date of Patent: Apr. 29, 2003

(54) METHOD FOR TREATING RESIDUES IN SEMICONDUCTOR PROCESSING CHAMBERS

(75) Inventors: Gurtej S. Sandhu, Boise, ID (US); Sujit Sharan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1165 days.

(21) Appl. No.: 08/649,262

(22) Filed: May 17, 1996

(51) Int. Cl.$^7$ .................................................. B08B 7/04
(52) U.S. Cl. ...................... 134/26; 134/1.1; 134/22.12
(58) Field of Search .................... 134/1, 1.2, 1.3, 134/2, 26, 22.1, 22.12

(56) References Cited

U.S. PATENT DOCUMENTS

| | | | |
|---|---|---|---|
| 4,576,698 A | 3/1986 | Gallagher et al. | 204/192 |
| 4,699,082 A | 10/1987 | Hakim | 118/716 |
| 4,803,127 A | 2/1989 | Hakim | 428/457 |
| 4,897,709 A | 1/1990 | Yokoyama et al. | 357/68 |
| 4,957,777 A | 9/1990 | Ilderem et al. | 427/55 |
| 4,977,106 A | 12/1990 | Smith et al. | 437/192 |
| 5,129,958 A * | 7/1992 | Nagashima et al. | 134/22.1 |
| 5,173,327 A | 12/1992 | Sandhu et al. | 427/573 |
| 5,271,963 A | 12/1993 | Eichman et al. | 427/248 |
| 5,326,723 A | 7/1994 | Petro et al. | 437/192 |
| 5,344,792 A | 9/1994 | Sandhu et al. | 437/200 |
| 5,348,587 A | 9/1994 | Eichman et al. | 18/723 MP |
| 5,356,478 A | 10/1994 | Chen et al. | 134/1 |
| 5,368,687 A * | 11/1994 | Sandhy et al. | 156/643 X |
| 5,413,670 A | 5/1995 | Langan et al. | 134/1.2 |
| 5,454,903 A | 10/1995 | Redeker et al. | 216/67 |
| 5,464,031 A * | 11/1995 | Buley et al. | 134/1 |
| 5,486,235 A | 1/1996 | Ye et al. | 134/1.1 |
| 5,492,735 A | 2/1996 | Saito | 427/569 |
| 5,658,391 A * | 8/1997 | Buley et al. | 134/1.1 |
| 5,709,772 A * | 1/1998 | Ghanaem et al. | 134/1.3 X |

OTHER PUBLICATIONS

Green et al., "Chemical Vapor Deposition of Ruthenium and Ruthenium Dioxide Films", *J. Electrochem. Soc.*, 132(11):2677–2685, Nov., 1985.

* cited by examiner

*Primary Examiner*—Alexander Markoff
(74) *Attorney, Agent, or Firm*—Fletcher, Yoder & Van Someren

(57) ABSTRACT

Metal-based residues in semiconductor processing chambers are treated using treatment gases to neutralize and/or facilitate removal of the residues. The treatment gases may neutralize reactive residues by conversion to essentially stable materials. The treatment gases may facilitate removal of residues by converting the residues to materials that are not strongly bound to semiconductor processing chamber surfaces.

34 Claims, 1 Drawing Sheet

METHOD FOR TREATING RESIDUES IN SEMICONDUCTOR PROCESSING CHAMBERS

BACKGROUND OF THE INVENTION

1. Field of the Invention

This invention relates generally to semiconductor processing and, more specifically, to treating residues in semiconductor processing chambers. In particular, this invention relates to a method for neutralizing and/or removing residues left by metal source gases, such as titanium tetrachloride ($TiCl_4$), on semiconductor processing chamber walls.

2. Description of the Related Art

In semiconductor manufacturing operations, semiconductor devices are formed using various processes, including deposition of conducting and insulating layers on semiconductor substrates. Continuing miniaturization of integrated circuits has required the development and use of methods for depositing new and different types of metal and metal-based layers on semiconductor substrates. These new types of layers include metal and metal oxide combinations that have been developed for use as both insulating and conducting layers. Among the most widely used of these new types of layers are titanium-based layers, such as titanium silicide ($TiSi_2$) and titanium (Ti). Other titaniumbased layers, including titanium oxide combinations, have also been contemplated. Thus, a wide variety of metal-based conductors and insulators are utilized in the art.

Chemical vapor deposition (CVD) and plasma enhanced chemical vapor deposition (PECVD) processes are used to deposit metal-based layers. Often the deposition process of such metal-based layers includes the use of a metal source known as a precursor. For example, CVD processes that employ titanium precursor deposition gases, such as titanium tetrachloride ($TiCl_4$), have often been employed to deposit these layers. For example, $TiSi_2$ has been deposited in a cold wall CVD reactor process by reacting $TiCl_4$ with a silicon source deposition gas, such as silane ($SiH_4$).

Metal deposition processes carried out in semiconductor processing chambers may leave contaminant deposits of metal precursor on the walls of a processing chamber. For example, in cold wall CVD deposition processes employing a $TiCl_4$ precursor, a residue derived from $TiCl_4$ is often deposited on the reactor chamber walls. In such a cold wall plasma CVD process for the deposition of $TiSi_2$ from $TiCl_4$ and $SiH_4$, the primary deposition reaction occurs at the surface of the semiconductor substrate which is heated to a reaction temperature, typically above about 300° C. However, the walls of a cold wall CVD reactor are typically maintained at temperatures ranging from around ambient to a maximum of about 250° C. At lower temperatures, $TiCl_4$ does not participate in the primary reaction and may instead deposit residues on the CVD chamber walls. These $TiCl_4$-derived residues are usually strongly bound to the interior of the reactor chamber and may be difficult to remove, remaining bound to the chamber walls even after long "pump downs" or evacuations of the semiconductor chamber. These deposits are also prone to causing accelerated corrosion of aluminum chamber walls and typically react readily with moisture-laden air, generating a white "smoke" when a reactor chamber is opened. Particles from this "smoke" may eventually settle from the air to coat surfaces within a fabrication clean room.

Although plasma cleaning methods exist which may be used for removing $TiCl_4$-derived residues from reactor chamber walls, these methods suffer from several disadvantages. First, plasma cleaning methods are typically directional or anisotropic, meaning only a portion of the interior surfaces of a reactor chamber are accessible for plasma cleaning. As a result, plasma cleaning may only be effective in removing $TiCl_4$-derived deposits from some parts of the reactor chamber, leaving $TiCl_4$-derived residue strongly bound to other areas of the chamber which are not directly exposed to the plasma. This remaining residue retains its potential for reacting with the atmosphere the next time the reactor chamber is opened. In addition, plasma cleaning methods require the installation of special equipment into a reactor chamber and may not always be available or desirable.

Consequently, a need exists for a method that is effective in neutralizing or removing metal-based deposits from substantially all areas of a semiconductor processing chamber. In particular, a need exists for a method of neutralizing and/or removing reactive $TiCl_4$-derived residues present in a cold wall CVD reactor chamber.

SUMMARY OF THE INVENTION

The present invention concerns a method for treating metal-based residues in semiconductor processing chambers with treatment gases that act to convert residues to substantially stable and/or removable materials.

This invention in one respect is a method for treating a metal-based residue in a semiconductor processing chamber by introducing a treatment gas into the processing chamber capable of interacting with the metal-based residue to form a substantially stable and removable treatment product.

This invention in another respect is a method for treating a metal-based residue present in a semiconductor processing chamber by introducing a treatment gas into the processing chamber under conditions effective to cause the treatment gas to interact with the metal-based residue to form a substantially stable and removable treatment product, and removing at least a portion of the treatment product from the semiconductor processing chamber.

This invention in a further respect is a method for neutralizing and removing a residue comprising at least one chloride of titanium from a cold wall CVD reactor chamber by providing and introducing an ammonia treatment gas into the cold wall CVD chamber so that an adduct salt of at least one chloride of titanium and ammonia is formed, and removing at least a portion of the adduct salt from the cold wall CVD reactor.

This invention in yet another respect is a method for neutralizing a metal-based residue in a semiconductor processing chamber by introducing a treatment gas into the processing chamber that is capable of neutralizing the metal-based residue.

The present invention offers advantages over methods previously employed to treat contaminants and residues in semiconductor processing chambers, including for example, the capability of neutralizing reactive metal-based residues that are strongly bound to surfaces of semiconductor processing chambers in areas not accessible to other cleaning methods, and converting these residues to substantially stable materials that may be easily removed from the chamber walls.

DETAILED DESCRIPTION OF SPECIFIC EMBODIMENTS

Figure 1:
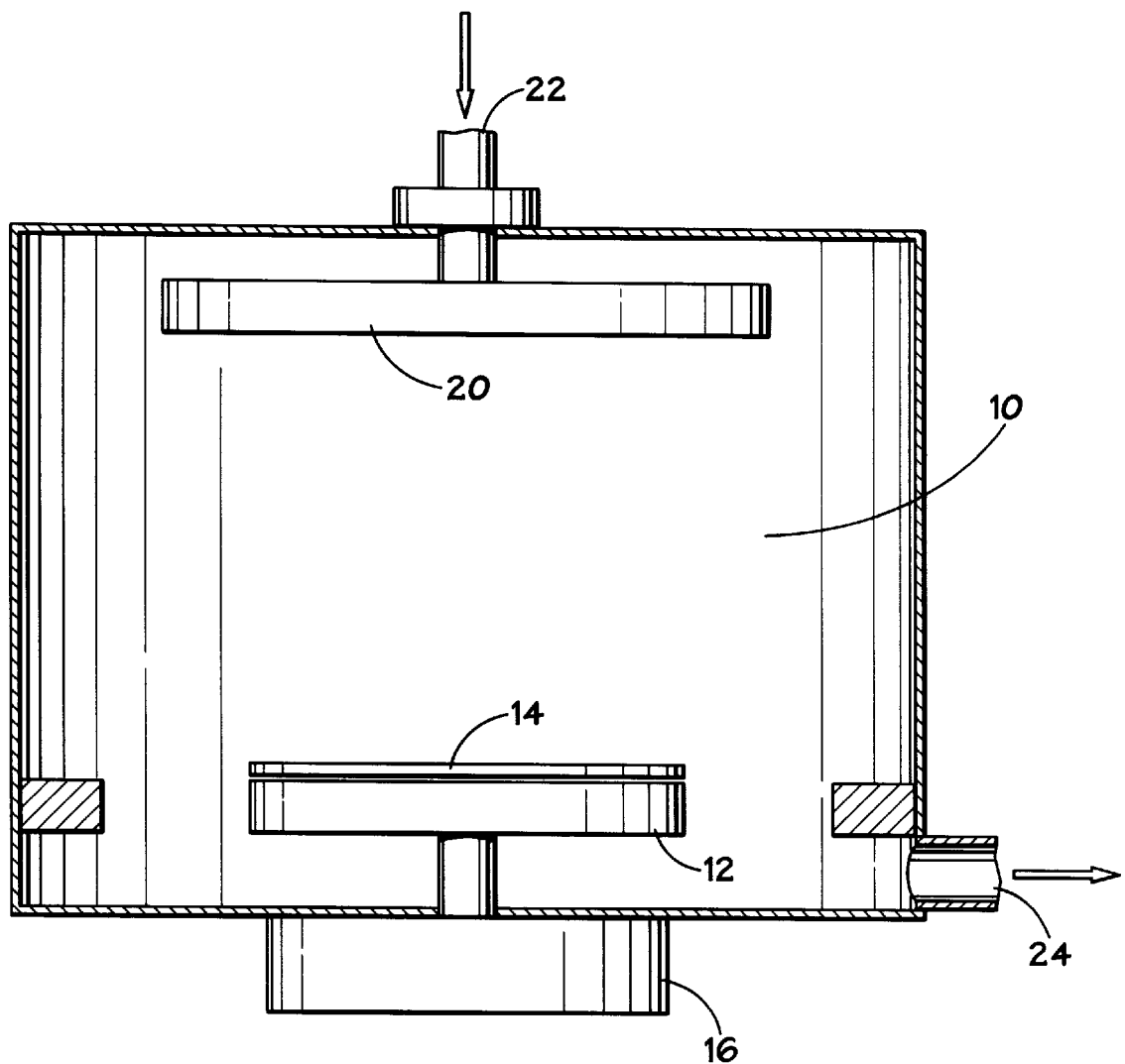
FIG. 1 is a cross sectional view of a prior art cold wall CVD reaction chamber.

When the term "CVD" is referred to herein in connection with the practice of the disclosed method, the term is intended to include any chemical vapor deposition method employed to process semiconductor devices, including plasma assisted CVD, non-plasma assisted CVD, radiant energy CVD, low pressure CVD, atmospheric CVD, etc. The terms "metal" or "metals" include metals, refractory metals, intermetallics, combinations thereof, and the like.

One embodiment of the disclosed method relates to a method for neutralizing and/or facilitating removal of metal-based deposits or residues from surfaces of a semiconductor processing chamber by contacting such deposits with treatment gas at relatively low temperatures to form a substantially stable and removable treatment product. A semiconductor processing chamber may be any chamber in which a semiconductor process using metal sources occurs. By "neutralizing" it is meant that tendency of a metal-based residue to react with other materials such as, for example, moisture, the atmosphere, or semiconductor processing chamber surfaces is substantially reduced. By "substantially stable" it is meant that the product does not readily react with other materials such as, for example, moisture, the atmosphere, or semiconductor processing chamber surfaces. By "substantially removable" it is meant that the product is not strongly bound to the chamber surfaces. In the practice of the disclosed method, a substantially stable and removable treatment product may be solid, liquid or gas, more typically solid or gas.

In the practice of the disclosed method, a "metal-based residue" may include any material comprising a metal, such as an element, compound, complex, mixture or other material. A "metal source" may be any element, inorganic or organic compound, complex or any other material used in semiconductor processing, such as a precursor source for deposition of metal-based layers on a semiconductor substrate. Although some metal-based residues are difficult to remove from processing chamber surfaces and/or are reactive in nature, it is not necessary in the practice of the disclosed method that a metal-based residue be reactive or difficult to remove. Benefits may also be obtained using the disclosed method for the purpose of altering a metal-based residue to a more desired form, such as a form that is easier to handle or which takes up less space. Although this method may be performed in the absence of plasma and at relatively low temperatures, the benefits of the method may also be obtained in the presence of plasma and/or at higher temperatures.

In the practice of the disclosed method, it is not necessary for a chemical reaction to occur between a metal-based residue and a treatment gas. Instead, the disclosed method may be practiced successfully using any mechanism capable of neutralizing or facilitating removal of metal-based residues including, but not limited to, formation of unbonded molecular associations, such as inclusion complexes. Substantially all of a metal-based residue may be neutralized and/or affected by interaction with a treatment gas, thereby preventing reaction with the atmosphere when a chamber is opened. However, only a portion of the metal-based residue may be affected to realize benefit from the method.

Because a corrosive residue may be converted to a substantially stable treatment product, accelerated corrosion of chamber parts in the presence of moisture may be prevented or at least reduced. A treatment product may be substantially stable, but not substantially removable. However, in those embodiments where a metal-based residue is converted to both a substantially stable and removable treatment product, it may then be removed by wet scrubbing, mechanically, a plasma clean, or other suitable method if desired. The disclosed method may be particularly effective in neutralizing and/or removing metal-based residues from inaccessible areas of chambers which cannot be reached by plasma cleans.

In one embodiment, a semiconductor processing chamber may be a cold wall CVD reactor and a metal-based residue may be derived from $TiCl_4$. However, the disclosed method may be practiced to neutralize or remove residues derived from other sources and mixtures of sources, such as those including $TiBr_4$, $TiI_4$, and/or $WF_6$. Residues may also be removed from any other type of semiconductor processing chamber in which metal-based residues may form. Metal-based residues may exist as solid, liquid or gaseous-based materials.

In a semiconductor processing chamber, $TiCl_4$ is typically converted to $TiCl_4$-derived residues comprising one or more chlorides of titanium, typically in the form of titanium trichloride or titanium dichloride, which may be difficult or virtually impossible to pump out of a chamber. However, residues derived from $TiCl_4$ may also contain one or more other chlorides of titanium, such as in the form of titanium monochloride or titanium tetrachloride, and may exist in many forms including, for example, in combination with other constituents such as radicals, or disposed in complexes or mixtures with other materials.

Examples of mechanisms believed to be responsible for reaction between $TiCl_4$-derived residues and moisture and/or oxygen in the atmosphere are given below for $TiCl_4$:

$TiCl_4 + 2H_2O \rightarrow TiO_2 + 4HCl$ (reaction of $TiCl_4$ with moisture)

$TiCl_4 + O_2 \rightarrow TiO_2 + 2Cl_2$ (reaction of $TiCl_4$ with oxygen)

Similar reactions are believed to occur for $TiCl_4$-derived residues comprising titanium monochloride, titanium dichloride and/or titanium trichloride. Of these, titanium residues comprising mono-, di- and tri-chlorides may be harder to remove from chamber walls than those titanium residues comprising tetrachlorides.

Reactions between air and/or moisture and $TiCl_4$-derived residues deposited on reactor chamber walls are undesirable for many reasons. White smoke generated from these reactions actually consists of fine particles, such as of the form $TiO_x$, which may eventually settle from the air, coating surfaces within the fabrication clean room where they may contaminate devices or wafers. In addition, products of the above reaction, such as HCl and/or chlorine may be prone to causing accelerated corrosion of aluminum chamber walls.

In one embodiment of the disclosed method, $TiCl_4$-derived residues are typically neutralized and/or removed using a treatment gas comprising ammonia ($NH_3$). However, other treatment gases and mixtures of treatment gases capable of forming substantially stable and removable treatment products with $TiCl_4$-derived residues may be successfully employed. One example of such a treatment gas is dimethyl amine $(CH_3)NH$. Additionally, these and other treatment gases may be used to form substantially stable and removable treatment products with metal-based residues derived from sources other than $TiCl_4$, such as those derived from $WF_6$, $TiBr_4$, $TiI_4$, or mixtures thereof (including mixtures with $TiCl_4$). Residues derived from other metal-based sources and mixtures of sources may also be treated.

In another embodiment, difficult to remove $TiCl_4$-derived residues containing chlorides of titanium in forms having three or less chlorine atoms may be converted to more easily removable residues containing $TiCl_4$ by exposure to chlorine or chlorine containing treatment gases. In a similar manner, difficult to remove $WF_6$-derived residues containing fluorides of tungsten in forms having five or less fluorine atoms, such as $WF_5$, may be converted to more easily removable residues containing $WF_6$ by exposure to fluorine or fluorine-containing treatment gases, such as HF. Residues containing $WF_6$ may then be removed by many suitable methods, including mechanical or wet wiping, or alternatively by exposing these residues to a temperature greater than about 10° C. to convert them to a gaseous form that may be easily pumped out. Such a method may be particularly desirable where higher temperatures necessary to convert residues containing five or less fluorine atoms are undesirable and/or unachievable. Other metal-halide-derived residues may be treated in the same manner, including residues comprising mono-, di-, and/or tri-bromides of titanium, and mono-, di- and/or tri-iodides of titanium, which may be converted from difficult to remove forms having three or less halogen atoms to more easily removed tetra-bromide or tetra-iodide forms. This may be accomplished by exposing these residues to bromine or bromine-containing gases such as HBr, and iodine or iodine-containing gases such as HI, respectively.

As an example, FIG. 1 illustrates just one type of prior art cold wall CVD reactor chamber 10 which may be treated according to the method of the present invention. This CVD reactor is of the type used to deposit metal-based layers on a semiconductor substrate from metal precursor gases, such as $TiCl_4$. In FIG. 1, chamber 10 has inlet 22 and outlet 24 through which process gases may be introduced and removed, respectively. Substrate holder 12 is provided to support semiconductor substrate 14 for processing. Heat may be supplied to semiconductor substrate 14 through substrate holder 12 by heat source 16, typically halogen lamps or other heating means known in the art. A shower head 20 may be provided to distribute process gases over semiconductor substrate 14. The method of the present invention may be practiced successfully with semiconductor processing chambers and CVD reactors of other designs as well. For example, deposition equipment using non-plasma and plasma assisted deposition processes, including commercially available deposition equipment from suppliers such as Applied Materials, Novellus and/or Genus may be utilized. Particular models of such equipment include Applied Materials 5000D, Novellus Concept I and Genus 8700.

In one embodiment of the disclosed method, a cold wall CVD chamber having $TiCl_4$-derived residues may be flooded with $NH_3$ at near ambient temperatures to form substantially stable and removable adduct salts comprising titanium chlorides and ammonia, such as those of the form $xTiCl_4 \cdot yNH_3$. Because these adduct salts are relatively inert, they will not react substantially with moisture in the atmosphere and do not pose a substantial corrosion hazard. In addition, these salts do not tend to become airborne and instead tend to remain on the chamber wall. Although $TiCl_4$-derived residues are converted to solid inclusion complex form in this embodiment, treatment gases which form gaseous treatment products may also be used. For example, a chlorine-containing treatment gas, such as $Cl_2$ or HCl, may be used to convert TiCl, $TiCl_2$, or $TiCl_3$-containing residues into $TiCl_4$-containing treatment products which may be removed in gaseous form under appropriate conditions, such as at temperatures of greater than about 400° C. In addition, plasma cleaning methods may also be used to assist in removal of $TiCl_4$-containing gaseous treatment products. In some cases, such conversion of metal-based residues to gaseous-removable treatment products may be particularly advantageous, since it reduces solid deposits which may require wet or mechanical cleaning. Additionally, while one treatment gas is typically used, metal-based residues may be exposed to mixtures of treatment gases, or to several treatment gases in sequence. As an example, a $TiCl_4$-derived residue comprising mono-, di-, or tri-chlorides may be exposed to a chlorine-containing treatment gas to cause conversion of the residue to a $TiCl_4$ form, followed by heating to gaseous form, plasma cleaning, and/or exposure to a $NH_3$ treatment gas for conversion to a solid adduct salt.

In one embodiment, a cold wall CVD chamber may be flooded with $NH_3$ for a period of time suitable to convert substantially all $TiCl_4$-derived residue to an adduct salt comprising chlorides of titanium and $NH_3$, typically from about 10 seconds to about 600 seconds. Flow rates will typically depend on a processing chamber volume. For example, $NH_3$ may be introduced into a 6 liter cold wall CVD reactor chamber at a flow rate that may be from about 10 standard cubic centimeters per minute (sccm) to about 10,000 sccm, typically from about 300 sccm to about 5000 sccm, and most typically about 500 sccm. During the time that a chamber is exposed to $NH_3$, the chamber wall may be maintained at a temperature of from about 10° C. to about 300° C., typically from about 25° C. to about 200° C. During this same time, the chamber pressure may be maintained at from about 0.1 Torr to about 100 Torr, typically from about 1 Torr to about 10 Torr.

In a further embodiment, once $NH_3$ has been introduced to a reactor chamber for a sufficient period of time to convert substantially all $TiCl_4$-derived residue to stable adduct salt, flow of $NH_3$ may be terminated, and the reactor chamber may be purged with an inert gas and opened for wet or mechanical cleaning. Although a continuous flow of $NH_3$ may be introduced and removed from a chamber in this embodiment, the benefit of this method may also be achieved utilizing a "batch" process, wherein a semiconductor processing chamber is filled with a fixed volume of treatment gas that is held within the chamber until substantially all metal-based residue is converted to a substantially stable and removable treatment product.

The benefit of the disclosed method may also be obtained by flooding a semiconductor processing chamber with treatment gas a number of times prior to removing a treatment product, as well as by removing a treatment product each time a chamber is flooded with treatment gas. In any event, once formed, a substantially stable and removable treatment product may be removed from a reactor chamber using any suitable means. For example, a gaseous treatment product may be removed by evacuation or pumping from a chamber, and a solid or liquid treatment product removed by plasma, wet scrubbing, or mechanical cleaning methods. Alternatively, because a treatment product may be substantially stable, it need not be removed at all in order to obtain benefit from the method.

In the case of a solid treatment product, plasma cleaning may only be effective in removing treatment product from areas of a chamber that are accessible to a plasma cleaning process. Therefore, in one embodiment, adduct salts comprising chlorides of titanium and $NH_3$ are typically removed from a cold wall CVD chamber by opening the chamber and wet scrubbing surfaces of the chamber. In this embodiment, substantially all areas of the reactor chamber may be cleaned with a wet cloth or other suitable wet scrubbing means, typically using a $H_2O_2$ mixture that comprises about 20 parts water to about 1 part $H_2O_2$. However, any other solution suitable for wet scrubbing may also be used, such as an approximate 1:1 mixture of ethylene glycol and water. Additionally, any other suitable method of cleaning may also be employed to remove a treatment product, including dry mechanical cleaning methods and other wet cleaning methods. A gaseous treatment product may be removed from a CVD reaction chamber in many ways, including during the course of normal pumping operations or by using special evacuation procedures.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims.

What is claimed is:

1. A method for treating a metal-based residue in a semiconductor processing chamber, comprising the step of:
   introducing a treatment gas into the processing chamber during a cleaning process, wherein said treatment gas interacts with the metal-based residue to form a removable treatment product that is substantially stable when exposed to air as compared with the metal-based residue; and
   opening the processing chamber to remove the treatment product.

2. The method of claim 1, wherein the introducing step is performed in the absence of plasma.

3. The method of claim 1, wherein the introducing step comprises the step of:
   introducing the treatment gas following a semiconductor processing step where a metal source is used, and prior to exposing the treatment product to the atmosphere.

4. The method of claim 1, wherein the semiconductor processing chamber is a cold wall CVD reactor.

5. The method of claim 1, wherein the metal-based residue comprises one or more chlorides of titanium.

6. The method of claim 5, wherein the treatment gas is ammonia and the removable treatment product is an adduct salt of one or more chlorides of titanium and ammonia.

7. The method of claim 1, wherein the step of introducing comprises the step of:
   allowing said introduced treatment gas to remain in the chamber for a length of time sufficient to convert a given portion of the metal-based residue to the removable treatment product.

8. The method of claim 1, wherein the removable treatment product comprises at least one of a solid, liquid, or a mixture thereof.

9. The method of claim 8, further comprising the step of:
   removing at least a portion of the removable treatment product from the semiconductor processing chamber by wet scrubbing.

10. The method of claim 8, further comprising the step of:
    removing at least a portion of the removable treatment product from the semiconductor processing chamber by plasma cleaning.

11. The method of claim 1, wherein the removable treatment product is a gas.

12. A method for treating a metal-based residue present in a semiconductor processing chamber, comprising the steps of:
    introducing a treatment gas into the processing chamber during a cleaning process under conditions effective to cause the treatment gas to interact with the metal-based residue to form a removable treatment product that is substantially stable when exposed to air as compared with the metal-based residue; and
    opening the processing chamber and removing at least a portion of the removable treatment product from the semiconductor processing chamber.

13. The method of claim 12, wherein the metal-based residue comprises at least one of a chloride of titanium, iodide of titanium, bromide of titanium, or a mixture thereof; and wherein the treatment gas comprises at least one of ammonia, dimethyl amine, chlorine-containing gas, fluorine-containing gas, iodine-containing gas, or a mixture thereof.

14. The method of claim 13, wherein the metal-based residue is a chloride of titanium, the treatment gas is ammonia, and the substantially stable and removable treatment product is an adduct salt of at least one chloride of titanium and ammonia.

15. The method of claim 13, wherein the step of introducing comprises the step of:
    allowing said introduced treatment gas to remain in the chamber for a length of time sufficient to convert a given portion of the metal-based residue to the removable treatment product.

16. The method of claim 14, wherein the step of introducing comprises the step of:
    allowing said introduced ammonia treatment gas to remain in the chamber for a length of time of from about 10 seconds to about 600 seconds.

17. The method of claim 12, wherein the removable treatment product comprises at least one of a solid, liquid, or a mixture thereof, and wherein the step of removing comprises the step of:
    heating the removable treatment product to a temperature necessary to convert the removable treatment product to a gas.

18. The method of claim 17, wherein the metal-based residue comprises at least one of a chloride of titanium, iodide of titanium, bromide of titanium, or a mixture thereof; and wherein the treatment gas comprises at least one of a chlorine-containing gas, fluorine-containing gas, iodine-containing gas, or a mixture thereof.

19. The method of claim 14, wherein the cold wall CVD reactor chamber surfaces are maintained at a temperature of from about 10° C. to about 300° C., and wherein a pressure of from about 0.1 Torr to about 100 Torr is maintained within the cold wall CVD reactor chamber.

20. The method of claim 14, wherein at least a portion of the removable treatment product is removed from the cold wall CVD reactor chamber by wet scrubbing.

21. The method of claim 14, wherein at least a portion of the removable treatment product is removed from the cold wall CVD reactor chamber by plasma cleaning.

22. A method for neutralizing and removing a residue comprising at least one chloride of titanium from a cold wall CVD reactor chamber, comprising the steps of:
    providing an ammonia treatment gas;
    introducing the ammonia treatment gas into the cold wall CVD chamber during a cleaning process so that an adduct salt of at least one chloride of titanium and ammonia is formed; and
    removing at least a portion of the adduct salt from the cold wall CVD reactor.

23. The method of claim 22, wherein a continuos flow of ammonia treatment gas is introduced to the cold wall CVD chamber.

24. The method of claim 22, wherein a fixed volume of treatment gas is introduced into the cold wall CVD reactor.

25. The method of claim 22, wherein the cold wall CVD reactor chamber surfaces are maintained at a temperature of from about 10° C. to about 300° C., and wherein a pressure of from about 0.1 Torr to about 100 Torr is maintained within the cold wall CVD reactor chamber.

26. The method of claim 25, wherein at least a portion of the adduct salt is removed by wet scrubbing.

27. The method of claim 25, wherein at least a portion of the adduct salt is removed by plasma cleaning.

28. A method for neutralizing a metal-based residue in a semiconductor processing chamber, comprising the step of:

introducing a treatment gas into the processing chamber during a cleaning process, wherein said treatment gas reduces the reactivity in air of the metal-based residue to produce a neutralized metal-based residue and opening the processing chamber to remove the neutralized metal-based residue.

29. The method of claim 28, wherein the neutralized metal-based residue comprises at least one of a solid, liquid, or a mixture thereof; and further comprising the step of:

removing the neutralized metal-based residue by wet scrubbing.

30. The method of claim 28, wherein the neutralized metal-based residue comprises at least one of a solid, liquid, or a mixture thereof; and further comprising the step of:

removing the neutralized metal-based residue by plasma cleaning.

31. The method of claim 28, wherein the neutralized metal-based residue comprises at least one of a solid, liquid, or a mixture thereof; and further comprising the step of:

heating the neutralized metal-based residue to a temperature necessary to convert the neutralized metal-based residue to a gas.

32. The method of claim 12, wherein the introducing step comprises the step of:

introducing the treatment gas following a semiconductor processing step where a metal source is used, and prior to exposing the treatment product to the atmosphere.

33. The method of claim 22, wherein the introducing step comprises the step of:

introducing the ammonia treatment gas following a semiconductor processing step where a titanium source is used, and prior to exposing the adduct salt to the atmosphere.

34. The method of claim 28, wherein the introducing step comprises the step of:

introducing the treatment gas following a semiconductor processing step where a metal source is used, and prior to exposing the neutralized metal-based residue to the atmosphere.

* * * * *